US009066429B2

(12) United States Patent
Nagase et al.

(10) Patent No.: US 9,066,429 B2
(45) Date of Patent: Jun. 23, 2015

(54) CONTROL DEVICE AND VEHICLE STEERING SYSTEM INCLUDING CONTROL DEVICE

(71) Applicant: JTEKT CORPORATION, Osaka-shi, Osaka (JP)

(72) Inventors: Shigeki Nagase, Nabari (JP); Motoo Nakai, Nara (JP)

(73) Assignee: JTEKT CORPORATION, Osaka (JP)

( * ) Notice: Subject to any disclaimer, the term of this patent is extended or adjusted under 35 U.S.C. 154(b) by 0 days.

(21) Appl. No.: 14/056,167

(22) Filed: Oct. 17, 2013

(65) Prior Publication Data
US 2014/0116798 A1 May 1, 2014

(30) Foreign Application Priority Data

Oct. 29, 2012 (JP) ................................. 2012-238277

(51) Int. Cl.
B62D 5/04 (2006.01)
H05K 1/02 (2006.01)
H05K 1/14 (2006.01)
(52) U.S. Cl.
CPC .............. *H05K 1/0298* (2013.01); *H05K 1/141* (2013.01); *H05K 2201/10166* (2013.01); *B62D 5/0463* (2013.01)
(58) Field of Classification Search
CPC ... H02M 7/003; B62D 5/0463; H05K 1/0298; H05K 1/141; H05K 2201/10166
USPC .......... 180/443, 444; 361/748, 720, 736, 688, 361/752; 318/139, 254, 256, 280, 287, 293
See application file for complete search history.

(56) References Cited

U.S. PATENT DOCUMENTS

| 7,635,046 | B2* | 12/2009 | Tominaga et al. | 180/444 |
| 7,667,971 | B2* | 2/2010 | Tominaga et al. | 361/706 |
| 7,989,997 | B2* | 8/2011 | Hashimoto et al. | 310/68 D |
| 2005/0118868 | A1* | 6/2005 | Nagashima | 439/607 |
| 2005/0162875 | A1 | 7/2005 | Rodriguez et al. | |
| 2007/0246289 | A1 | 10/2007 | Tominaga | |

FOREIGN PATENT DOCUMENTS

| EP | 2 251 243 A1 | 11/2010 |
| JP | 2009-248864 A | 10/2009 |
| JP | A-2011-83063 | 4/2011 |

OTHER PUBLICATIONS

Feb. 6, 2015 Extended Search Report issued in European Application No. 13 18 9529.

* cited by examiner

Primary Examiner — Joseph Rocca
Assistant Examiner — Jacob Knutson
(74) Attorney, Agent, or Firm — Oliff PLC

(57) ABSTRACT

A circuit board includes control circuit patterns and first drive circuit patterns. A base maintains the circuit board in a state in which the base is opposed to a portion of the circuit board, in which the control circuit patterns are formed, across a space that allows control circuit elements to be mounted at the circuit board. A line module includes second drive circuit patterns electrically connected to the first drive circuit patterns so as to constitute a part of lines of a drive circuit, and is sandwiched between a portion of the circuit board, in which the first drive circuit patterns are formed, and the base.

6 Claims, 7 Drawing Sheets

CONTROL DEVICE AND VEHICLE STEERING SYSTEM INCLUDING CONTROL DEVICE

INCORPORATION BY REFERENCE/RELATED APPLICATION

This application claims priority to Japanese Patent Application No. 2012-238277 filed on Oct. 29, 2012, the disclosure of which, including the specification, drawings and abstract, is incorporated herein by reference in its entirety.

BACKGROUND OF THE INVENTION

1. Field of the Invention

The invention relates to a control device including a multi-layer circuit board in which a plurality of circuit conductors and a plurality of insulating layers are stacked such that each of the insulating layers is interposed between the adjacent circuit conductors, and relates to a vehicle steering system including the control device.

2. Description of Related Art

Conventionally, as a control device used in a vehicle steering system or the like, a control device that controls the operation of an electric motor has been known. This control device includes a circuit board having a control circuit that outputs a control signal, and a drive circuit that controls the on/off states of switching elements such as FETs in response to the control signal, so as to supply a drive current to the electric motor. Further, in recent years, in order to reduce the size of a circuit and to increase the density of the circuit, there have been employed circuit boards having a multi-layer structure in which a plurality of circuit conductor layers on which circuit patterns are formed, and a plurality of insulating layers are stacked such that each of the insulating layers is interposed between the adjacent circuit conductor layers.

As an example of the control device as described above, a control device is described in Japanese Patent Application Publication No. 2011-83063 (JP 2011-83063 A). In the control device described in JP 2011-83063 A, a control circuit portion, in which a control circuit pattern constituting lines of a control circuit is formed, and a drive circuit portion, in which a drive circuit pattern constituting lines of a drive circuit is formed, are formed respectively in separate areas on a single circuit board having a multi-layer structure, that is, the control circuit and the drive circuit are formed on one circuit board. The control device described in JP 2011-83063 A has an advantage that the size of the control device can be easily reduced, as compared to a control device in which the control circuit and the drive circuit are formed respectively on separate circuit boards that are connected to one another by a connection component such as a bus bar.

In recent years, there have been demands for further reducing the size of the control device. However, in the configuration described in JP 2011-83063 A, the entire control circuit portion and the entire drive circuit portion are formed on the single circuit board in the form of a flat plate. Thus, it is difficult to reduce the size of the circuit board in a planar direction, and accordingly, it is difficult to reduce the size of the control circuit board in the control device.

SUMMARY OF THE INVENTION

The invention provides a control device with a reduced size, and a vehicle steering system including the control device.

According to a feature of an example of the invention, there is provided a control device including a multi-layer circuit board in which a plurality of circuit conductors and a plurality of insulating layers are stacked such that each of the insulating layers is interposed between the adjacent circuit conductors, the control device including: the plurality of circuit conductors including a control circuit portion that outputs a control signal and a drive circuit portion that is controlled in response to the control signal; a line module directly fitted to the multi-layer circuit board, and connected to the drive circuit portion of the multi-layer circuit board; and a base that retains the line module or the multi-layer circuit board.

BRIEF DESCRIPTION OF THE DRAWINGS

The foregoing and further objects, features and advantages of the invention will become apparent from the following description of example embodiments with reference to the accompanying drawings, wherein like numerals are used to represent like elements, and wherein.

DETAILED DESCRIPTION OF EMBODIMENTS

Hereinafter, embodiments of the present invention will be described with reference to the accompanying drawings.

Figure 1:
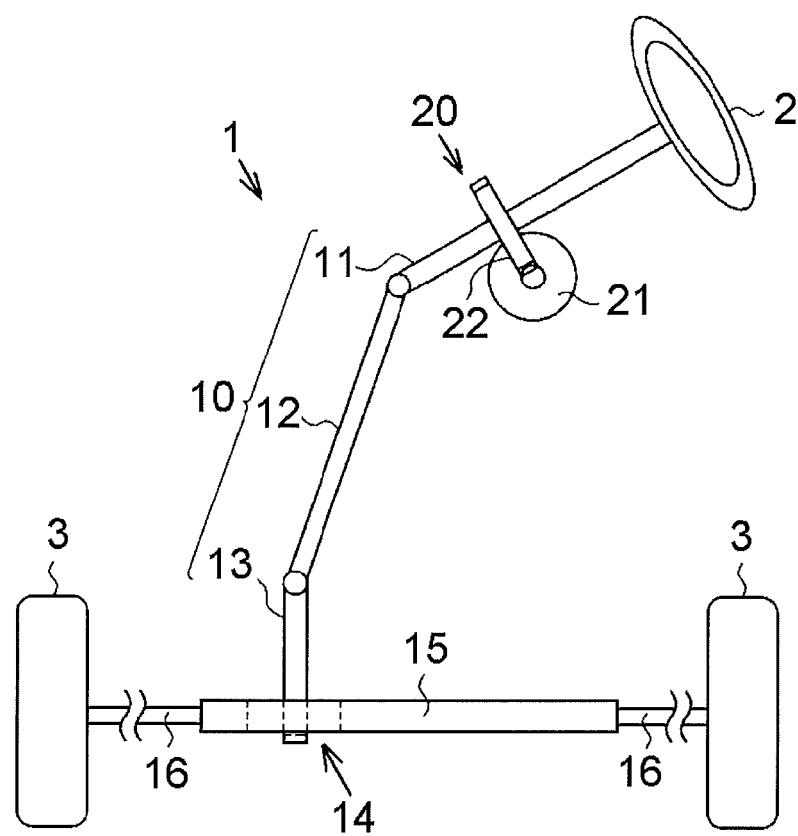
FIG. 1 is a schematic view illustrating a configuration of a vehicle steering system in an embodiment of the present invention.

A configuration of a vehicle steering system 1 will be described with reference to FIG. 1. In the vehicle steering system 1, a steering shaft 10, to which a steering component 2 is fixed, is connected to a rack shaft 15 through a rack and pinion mechanism 14. The steering shaft 10 includes a column shaft 11, an intermediate shaft 12 and a pinion shaft 13 that are connected to each other. In the vehicle steering system 1, the rotation of the steering shaft 10 in response to a steering operation is converted to a reciprocating linear motion of the rack shaft 15 through the rack and pinion mechanism 14. Then, the reciprocating linear motion of the rack shaft 15 is transmitted to knuckles (not shown) through tie rods 16 connected to opposite ends of the rack shaft 15, and thus, a steering angle of steered wheels 3, that is, a traveling direction of a vehicle is changed.

The vehicle steering system 1 includes an assist device 20 that applies an assist force to the column shaft 11. The vehicle steering system 1 is configured as a column assist type electric power steering system in which an operation of the steering component 2 is assisted by the assist device 20.

In the assist device 20, an electric motor 21 serving as a drive source for the assist device 20 is connected to the column shaft 11 through a speed reduction mechanism 22 so that the column shaft 11 is driven by the electric motor 21. The assist device 20 transmits rotation of the electric motor 21 to the column shaft 11 after the speed of the rotation from the electric motor 21 is reduced through the speed reduction mechanism 22, so as to apply a torque of the electric motor 21 as an assist force to the column shaft 11. It is to be noted that the assist device 20 corresponds to "an electric actuator".

Figure 2:
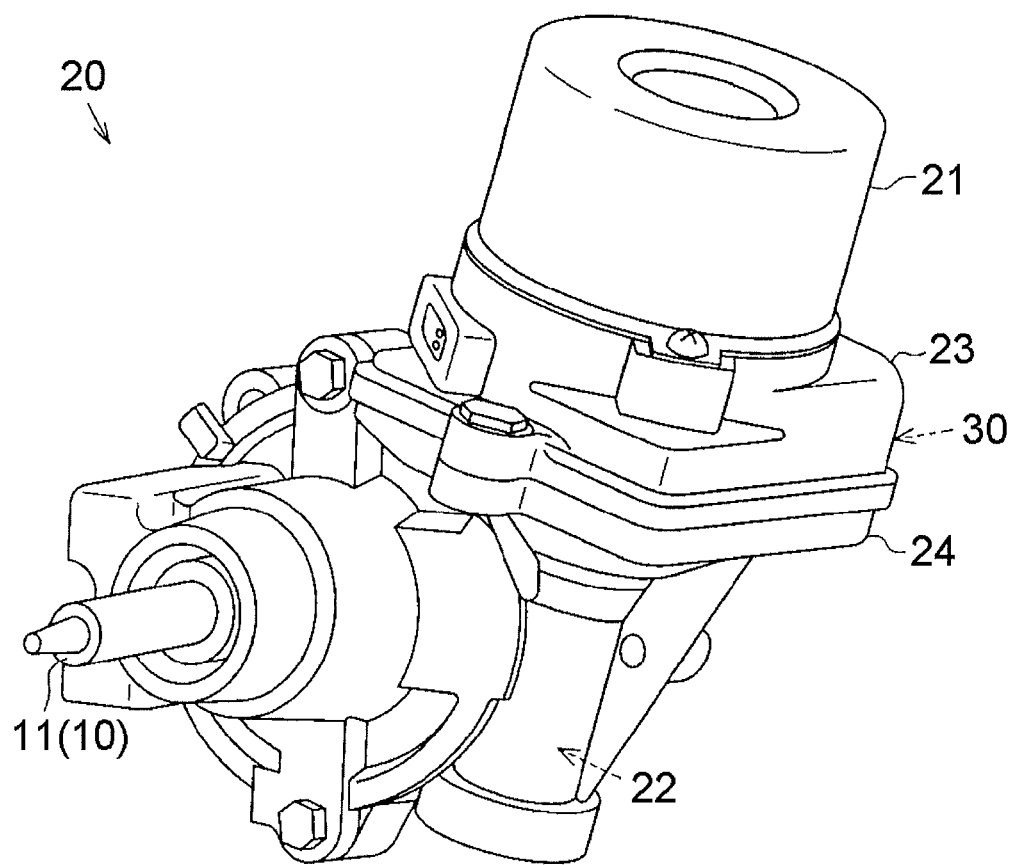
FIG. 2 is a perspective view illustrating a perspective structure of an assist device in the embodiment.

As shown in FIG. 2, the assist device 20 includes a control device 30 that controls the operation of the electric motor 21. The control device 30 is located between a first housing 23 to which the electric motor 21 is fixed, and a second housing 24 in which the speed reduction mechanism 22 is accommodated.

Figure 3:
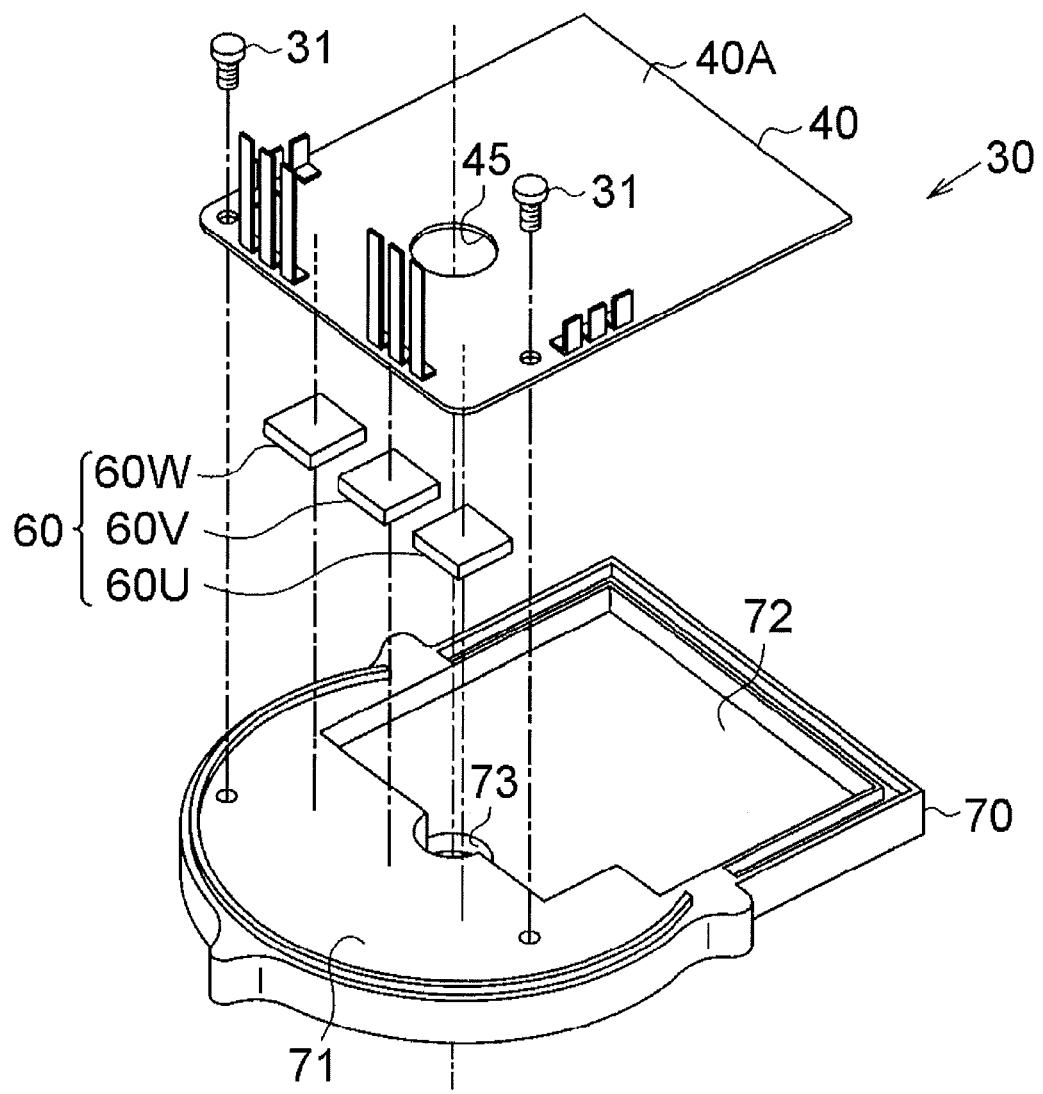
FIG. 3 is a perspective view illustrating an exploded perspective structure of a control device in the embodiment.

As shown in FIG. 3, the control device 30 has a configuration in which a circuit board 40 is fixed to a base 70 by two bolts 31 in a state in which line modules 60 are held between a base 70 and the circuit board 40.

A control circuit that outputs a control signal, and a part of a drive circuit that supplies a drive current to the electric motor 21 (refer to FIG. 2) in response to the control signal are formed in the circuit board 40. The circuit board 40 is fixed to a surface of the base 70, the surface being located at the electric motor 21-side. The circuit board 40 has a through-hole 45 through which an output shaft (not shown) of the electric motor 21 is inserted.

The line modules 60 constitute a part of an inverter circuit that converts a DC current to a three-phase AC current in the drive circuit. The line modules 60 are electrically connected to the drive circuit in the circuit board 40. The line modules 60 are fixed to the base 70 through thermal grease 74 (refer to FIG. 4). The line modules 60 include a U-phase line module 60U that constitutes a U-phase portion of the inverter circuit, a V-phase line module 60V that constitutes a V-phase portion of the inverter circuit, and a W-phase wring module 60W that constitutes a W-phase portion of the inverter circuit.

Figure 4:
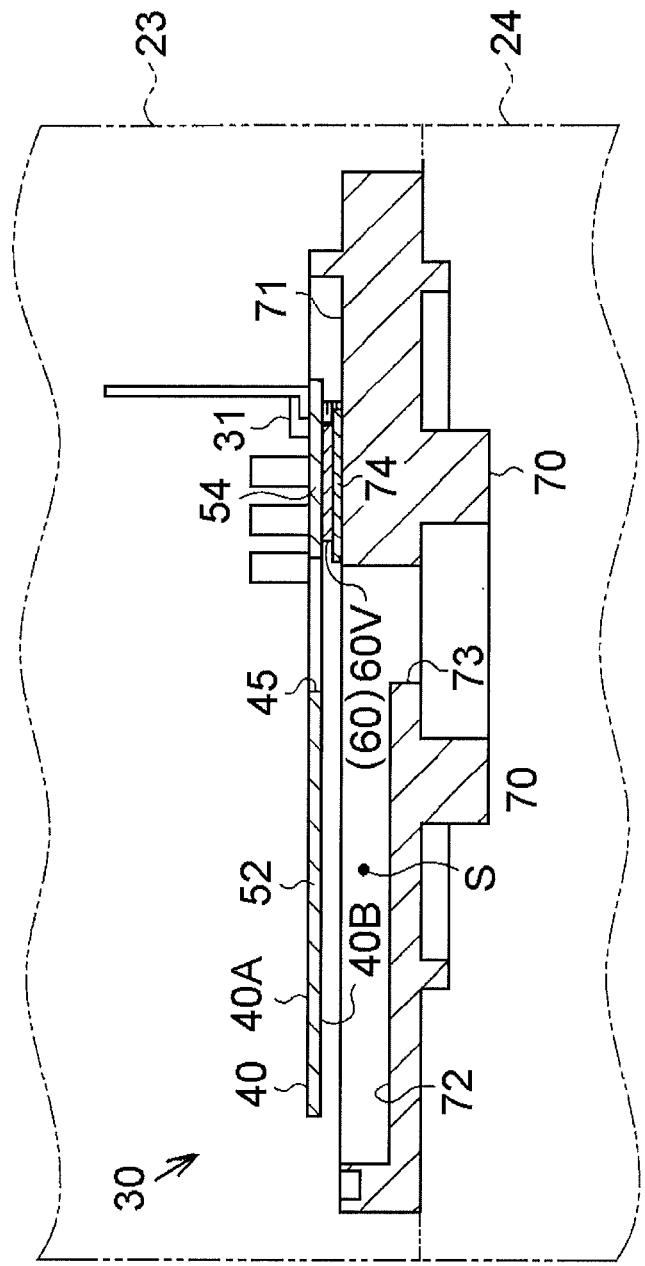
FIG. 4 is a sectional view illustrating a sectional structure of the control device in the embodiment.

The base 70 is sandwiched between the first housing 23 and the second housing 24 (refer to FIG. 4). The base 70 is made of a metal material having a high coefficient of thermal conductivity, such as aluminum alloy. A module (not shown) having a connector portion for electrically connecting the circuit board 40 to an external battery (not shown) is fixed to a portion of the base 70, the portion being located at the electric motor 21-side. The base 70 has a mounting surface 71 on which the circuit board 40 is mounted, a recessed portion 72, and a through-hole 73 through which the output shaft of the electric motor 21 is inserted. A space S (refer to FIG. 4) is formed between the recessed portion 72 and the circuit board 40.

Figure 5:
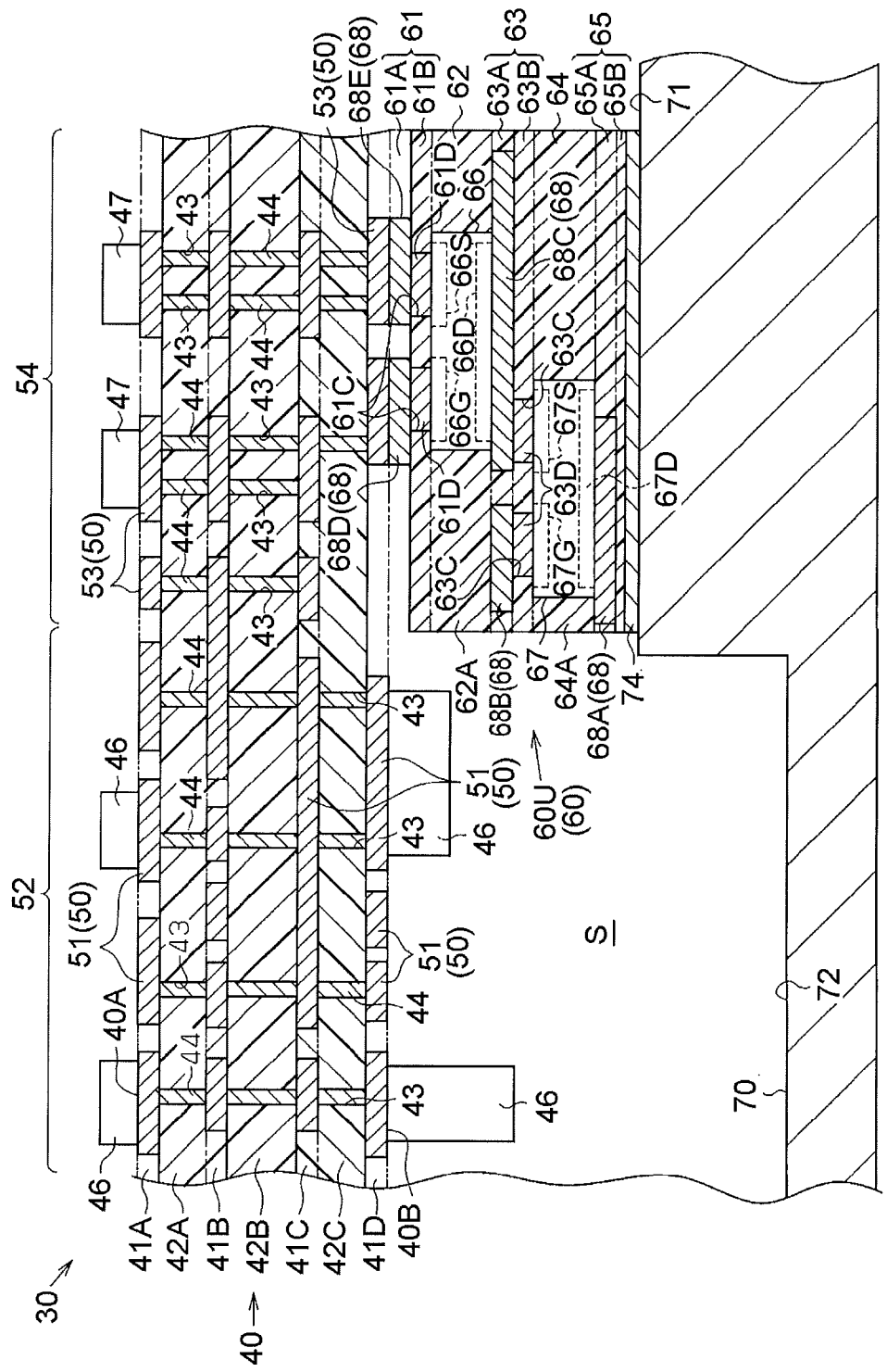
FIG. 5 is a sectional view illustrating a sectional structure of a line module, and portions around the line module in the embodiment.

With reference to FIG. 5 and FIG. 6, the structures of the circuit board 40 and the line modules 60 will be described in detail. It is to be noted that structures of the line modules 60U, 60V, 60W (refer to FIG. 3) in the line modules 60 are the same. Thus, the structure of the U-phase line module 60U alone will be described while the description of the structures of the V-phase line module 60V and W-phase module 60W will be omitted.

The circuit board 40 is configured as a multi-layer circuit board in which first to fourth circuit conductor layers 41A to 41D, and first to third insulating layers 42A to 42C are stacked such that each of the insulating layers is interposed between the adjacent circuit conductor layers. Specifically, in the circuit board 40, the first circuit conductor layer 41A, the first insulating layer 42A, the second circuit conductor layer 41B, the second insulating layer 42B, the third circuit conductor layer 41C, the third insulating layer 42C and the fourth circuit conductor layer 41D are disposed in the stated order from a side remote from the base 70. It is to be noted that the first to fourth circuit conductor layers 41A to 41D correspond to "a plurality of circuit conductors".

Predetermined circuit patterns 50 are formed on the first to fourth circuit conductor layers 41A to 41D by removing parts of conductor foils such as copper foils. An insulating resin material is provided to fill gaps between lines that constitute the circuit patterns 50 on the second and third circuit conductor layers 41A, 41C. The first to third insulating layers 42A to 42C are made of the insulating resin material, and thus, insulation between the circuit patterns 50 adjacent to each other is maintained.

Via holes 43, which extend through predetermined circuit conductor layers and insulating layers in a stacking direction, are formed in the circuit board 40. Connection components 44 made of a conductor material such as copper are inserted in inner peripheral portions of the via holes 43 in the circuit board 40. In the circuit board 40, each of the control circuit and the drive circuit is configured in the form of a three-dimensional circuit by electrically connecting the circuit patterns 50 on different circuit conductor layers, to each other through the connection components 44.

The circuit patterns 50 are formed such that control circuit patterns 51 constituting the lines of the control circuit, and first drive circuit patterns 53 constituting the lines of a part of the drive circuit are located respectively in areas that are separated from each other in a planar direction of the circuit board 40, within the first to fourth circuit conductor layers 41A to 41D. Thus, the circuit board 40 is formed such that a control circuit portion 52 in which the control circuit patterns 51 are formed, and a drive circuit portion 54 in which the first drive circuit patterns 53 are formed are located respectively in the areas that are separated from each other in the planar direction of the circuit board 40.

The control circuit portion 52 is opposed to the recessed portion 72 of the base 70. The space S is formed as a space between the control circuit portion 52 and the recessed portion 72. Control circuit elements 46 such as ICs are mounted in the control circuit portion 52 so as to be located in the space S. In the control circuit portion 52, the control circuit elements 46 are mounted at opposite side surfaces, that is, a surface 40A and a reverse surface 40B of the circuit board 40. It is to be noted that the control circuit elements 46 correspond to "a circuit element".

The drive circuit portion 54 is opposed to a mounting surface 71 of the base 70. The line modules 60 are sandwiched between the drive circuit portion 54 and the mounting surface 71. In the drive circuit portion 54, drive circuit elements 47 are mounted at the surface 40A of the circuit board 40.

The U-phase line module 60U is formed by stacking first to fifth substrates 61 to 65. The U-phase line module 60U is formed of the first substrate 61, the second substrate 62, the third substrate 63, the fourth substrate 64 and the fifth substrate 65, which are disposed in the stated order from a side opposite to the base 70.

In the first substrate 61, a first circuit conductor layer 61A is stacked on a side of a first insulating layer 61B, the side being opposite to the base 70. The first substrate 61 has two via holes 61C extending through the first insulating layer 61B in the stacking direction. In the first substrate 61, connection components 61D made of a conductor material such as copper are inserted respectively in inner peripheral portions of the via holes 61C.

In the second substrate 62, a lower stage side semiconductor component 66 as a MOSFET is inserted in an insertion hole extending through a second insulating layer 62A in the stacking direction. In the third substrate 63, a second circuit conductor layer 63A is stacked on a side of a third insulating layer 63B, the side being opposite to the base 70. The third substrate 63 has two via holes 63C extending through the third insulating layer 63B in the stacking direction. In the third substrate 63, connection components 63D made of a conductor material such as copper are inserted respectively in inner peripheral portions of the via holes 63C.

In the fourth substrate 64, an upper stage side semiconductor component 67 as a MOSFET is inserted in an insertion hole extending through a fourth insulating layer 64A in the stacking direction. In the fifth substrate 65, a third circuit conductor layer 65A is stacked on a side of a fifth insulating layer 65B, the side being opposite to the base 70.

In the first to third circuit conductor layers 61A, 63A, 65A, parts of conductor foils such as copper foils are removed so as to form second drive circuit patterns 68 that constitute a part of the inverter circuit. An insulating resin material is provided to fill gaps between lines that constitute the second drive circuit patterns 68. The insulating layers 61B, 62A, 63B, 64A, 65B are made of the insulating resin material, and thus, insulation between the second drive circuit patterns 68 adjacent to each other is maintained.

The second drive circuit patterns 68 have a drain line 68A, an upper stage gate line 68B, a series line 68C, a lower stage gate line 68D and a source line 68E. The second drive circuit patterns 68 are electrically connected to the first drive circuit pattern 53 on the fourth circuit conductor layer 41D of the circuit board 40. More specifically, the connection portion of the second drive circuit patterns 68, which is connected to the first drive circuit pattern 53, is in contact with the first drive circuit pattern 53 on the fourth circuit conductor layer 41D of the circuit board 40. Thus, the line modules 60 are directly attached to the circuit board 40.

The upper stage side semiconductor component 67 and the lower stage side semiconductor component 66 are stacked in the stacking direction of the U-phase line module 60U. The upper stage side semiconductor component 67 and the lower stage side semiconductor component 66 have portions which are overlapped with each other in the planar direction of the U-phase line module 60U. It is to be noted that the upper stage side semiconductor component 67 constitutes a high potential-side switching element in the inverter circuit, and the lower stage side semiconductor component 66 constitutes a low potential-side switching element in the inverter circuit.

A drain terminal 67D of the upper stage side semiconductor component 67 is connected to the drain line 68A. A gate terminal 67G of the upper stage side semiconductor component 67 is connected to the upper stage gate line 68B through one of the connection components 63D. A source terminal 67S of the upper stage side semiconductor component 67 is connected to the series line 68C through the other of the connection components 63D.

A drain terminal 66D of the lower stage side semiconductor component 66 is connected to the series line 68C. A gate terminal 66G of the lower stage side semiconductor component 66 is connected to the lower gate line 68D through one of the connection components 61D. A source terminal 66S of the lower stage side semiconductor component 66 is connected to the source line 68E through the other of the connection components 61D.

Figure 6A:
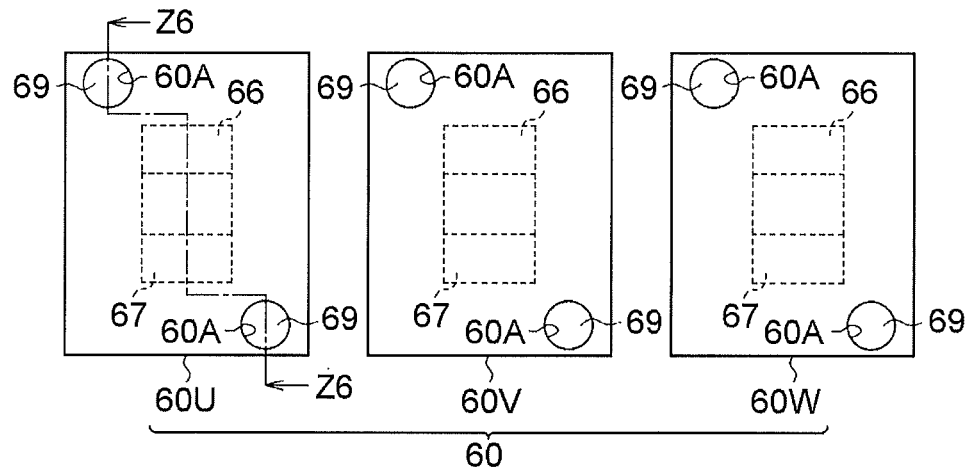
FIG. 6A is a plan view illustrating a planar structure of line modules in the embodiment.

As shown in FIG. 6A, each of the line modules 60U, 60V, 60W has two struts 69. The struts 69 are arranged around the upper stage side semiconductor component 67 and the lower stage side semiconductor component 66 at diagonal positions among four corner positions in each of the line modules 60U, 60V, 60W.

Figure 6B:
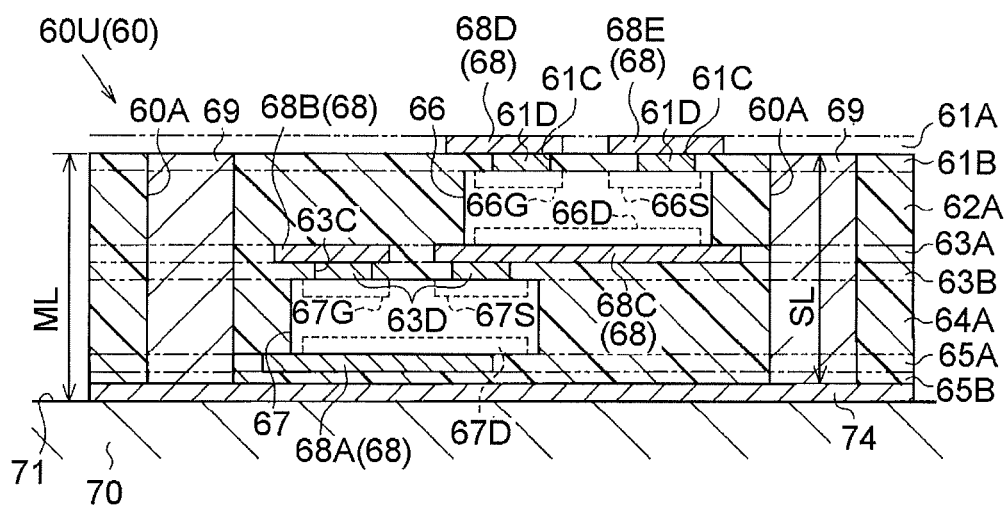
FIG. 6B is a sectional view illustrating a sectional structure taken along a plane Z6-Z6 in FIG. 6A.

As shown in FIG. 6B, the U-phase line module 60U has two through-holes 60A that extend through the second and third circuit conductor layers 63A, 65A and the insulating layers 61B, 62A, 63B, 64A, 65B in the stacking direction. In the U-phase line module 60U, the struts 69 are inserted respectively in the two through-holes 60A.

The struts 69 are made of a metal material, and are formed in a columnar shape. The struts 69 have a size SL in the stacking direction, which is equal to a size ML of the U-phase line module 60U in the stacking direction. The struts 69 are not electrically connected to the second drive circuit patterns 68.

Referring to FIG. 5, a method of producing the control device 30 will be described. The method of producing the control device 30 includes a circuit board production process, a line module production process and a combining process.

In the circuit board production process, an operator sandwiches the insulating resin material between conductor foils that constitute any two of the first to fourth circuit conductor layers 41A to 41D, so as to form a plate body, and then removes parts of the conductor foils by etching or the like so as to form the given circuit patterns 50. Then, the operator stacks another conductor foil on the plate body with the insulating resin material being sandwiched between the conductor foil and the circuit pattern 50, and then the circuit pattern 50 is formed on the conductor foil. This step of forming the circuit pattern 50 is repeated. Further, the operator forms the via holes 43, and fits the connection components 44 in the inner peripheral portions of the via-holes 42.

The line module production process includes a substrate preparing step and a substrate stacking step. In the substrate preparing step, the operator prepares the first to fifth substrates 61 to 65. In a state where the first circuit conductor layer 61A is stacked on the first insulating layer 61B in the first substrate 61, the operator removes parts of the conductor foil by etching or the like so as to form the given second drive circuit pattern 68. Then, the operator forms the via holes 61C and the through-holes 60A, and fits the connection components 61D in the inner peripheral portions of the via-holes 61C. It is to be noted that explanation on the third substrate 63 will be omitted since the third substrate 63 is similarly processed. Then, the operator forms the insertion hole and the through-holes 60A in the second insulating layer 62A of the second substrate 62, and inserts the lower stage side semiconductor component 66 in the inner peripheral portion of the insertion hole. It is to be noted that explanation on the fourth substrate 64 will be omitted since the fourth substrate 64 is similarly processed. Further, in a state where the third circuit conductor layer 65A is stacked on the fifth insulating layer 65B in the fifth substrate 65, the operator removes parts of the conductor foil by etching or the like so as to form the given second drive circuit pattern 68. Then, the operator forms the through-holes 60A.

In the substrate stacking step, at first, the operators stacks the first to fifth substrates 61 to 65. Then, the operator inserts the struts 69 in the through-holes 60A. Then, the operator presses the first to fifth substrates 61 to 65 while heating the first to fifth substrates 61 to 65 so as to fix the first to fifth substrates 61 to 65 to each other.

In the combining process, the operator prepares the circuit board 40 produced by the circuit board production process and the line modules 60U, 60V, 60W produced by the line module production process. Then, the operator welds the fourth circuit conductor layer 41D of the circuit board 40 to the first circuit conductor layer 61A of each of the line modules 60. Then, the operator places the line modules 60 on the mounting surface 71 of the base 70. Then, the operator places the circuit board 40 on the line modules 60. At this time, the control circuit portion 52 of the circuit board 40 is opposed to the recessed portion 72 of the base 70. Thereafter, the operator fixes the circuit board 40 to the base 70 with the use of bolts 31.

Effects of the control device 30 in this embodiment will be described. The control device 30 has first to fourth features. The first feature is a feature that the area of the control circuit portion 52 is reduced in the planar direction of the circuit board 40. The second feature is a feature that the area of the drive circuit portion 54 is reduced in the planar direction of the circuit board 40. The third feature is a feature that the semiconductor components 66, 67 are restrained from overheating. The fourth feature is a feature that a load applied to the semiconductor components 66, 67 is reduced during the production of the control device.

The first feature will be described in detail. In the control device 30, since the recessed portion 72 is formed in the base 70, and the line modules 60U, 60V, 60W are sandwiched between the circuit board 40 and the base 70, the space S is formed between the control circuit portion 52 and the base 70. Thus, in the control circuit portion 52, the control circuit elements 46 can be mounted and the control circuit pattern 51 can be formed, at each of the surface 40A and the reverse surface 40B of the control circuit 40. Thus, as compared with the conventional configuration in which the control circuit elements 46 can be mounted and the control circuit pattern 51 can be formed only at the surface 40A of the circuit board 40, it is possible to reduce the size of the circuit board 40, in the planer direction of the circuit board 40, for ensuring a mounting area necessary for forming the control circuit.

The second feature will be described in detail. The control device 30 includes the line modules 60 located between the circuit board 40 and the mounting surface 71 of the base 70. Thus, in the drive circuit portion 54, the drive circuit elements 47 can be mounted and the first drive circuit pattern 53 can be formed at each of the surface 40A and the reverse surface 40B of the circuit board 40. Thus, as compared to a conventional configuration in which drive circuit elements 47 can be mounted and the first drive circuit pattern 53 can be formed only at the surface 40A of the circuit board 40, it is possible to reduce the size of the circuit board 40, in the planar direction of the circuit board 40, for ensuring a mounting area necessary for forming the drive circuit.

The third feature will be explained in detail. The line modules 60 are sandwiched between the circuit board 40 and the mounting surface 71 of the base 70. Thus, heat of the semiconductor components 66, 67 in the line modules 60 is transferred through a first thermal path and a second thermal path. In the first thermal path, the heat is transferred to the first drive circuit patterns 53 of the circuit board 40 by way of the second drive circuit patterns 68 of the line modules 60. In the second thermal path, the heat is transferred to the base 70 by way of the second drive circuit patterns 68 of the line modules 60. Thus, since the control device 30 has two thermal paths for the semiconductor components 66, 67, the heat of the semiconductor components 66, 67 is easily transferred from the semiconductor components 66, 67 to the outside.

Further, as to the second thermal path, since the semiconductor components 66, 67 are provided in the line modules 60, the distances between the semiconductor components 66, 67 and the base 70 are short, as compared to a hypothetical configuration in which the semiconductor components 66, 67 are mounted at surfaces of the line modules 60, the surfaces being located on the side opposite to the base 70. Thus, the heat of the semiconductor components 66, 67 is easily transferred to the base 70. Therefore, the semiconductor components 66, 67 are restrained from overheating.

The fourth feature will be described in detail. The control device 30 includes the struts 69 located around the semiconductor components 66, 67 in the line modules 60. Further, the size SL of the struts 69 is equal to the size ML of the line modules 60. Thus, in the substrate stacking process, the struts 69 bear the load that is applied to the first to fifth substrates 61 to 65 when the first to fifth substrates 61 to 65 are pressed. Thus, the load, which is applied to the semiconductor components 66, 67 when the first to fifth substrates 61 to 65 are pressed, is small, as compared to a hypothetical configuration in which the struts 69 are omitted from the line modules 60. Further, the struts 69 bear the load with which the line modules 60 are pressed against the base 70 by the circuit board 40 due to a fastening force of the bolts 31 when the circuit board 40 is fixed to the base 70 with the use of the bolts 31. Thus, the load applied to the semiconductor components 66, 67 from the circuit board 40 is small, as compared to the configuration in which no strut 69 is provided.

The vehicle steering system 1 in the embodiment have the following effects. (1) In the control device 30, the space S is formed between the control circuit portion 52 of the circuit board 40 and the base 70. With this configuration, the size of the circuit board 40 is small in the planer direction of the circuit board 40, as compared to a conventional configuration in which the control circuit elements 46 can be mounted and the control circuit pattern 51 can be formed only at the surface 40A of the circuit board 40. Thus, the size of the circuit board 40 can be reduced in the planer direction of the circuit board 40.

(2) The control device 30 includes the line modules 60 located between the circuit board 40 and the mounting surface 71 of the base 70. With this configuration, the size of the circuit board 40 is small in the planer direction of the circuit board 40, as compared to a hypothetical configuration in which the drive circuit elements 47 can be mounted and the first drive circuit pattern 53 can be formed only at the surface 40A of the circuit board 40. Thus, the size of the control device 30 can be reduced in the planer direction of the circuit board 40. Further, as compared to a conventional configuration in which the circuit board 40 and the line modules 60 are separated from each other, and are connected to each other by connection components such as bus bars, the size of the control device 30 can be reduced.

(3) In each of the line modules 60U, 60V, 60W, the circuit conductor layers 61A, 63A, 65A are stacked. With this configuration, the sizes of the line modules 60U, 60V, 60W are small, as compared to a conventional configuration in which a part of the drive circuit portion 54 of the line module 60 is formed by a single circuit conductor layer.

(4) The line modules 60 are sandwiched between the circuit board 40 and the mounting surface 71 of the base 70. With this configuration, the heat of the semiconductor components 66, 67 is easily transferred to the base 70. Thus, the semiconductor components 66, 67 can be restrained from overheating. Thus, it is possible to restrain the drive circuit from overheating.

(5) The vehicle steering system 1 includes the control device 30. With this configuration, it is possible to provide the vehicle steering system 1 that has good mountablility, since the size of the control device 30 is reduced.

(6) The control device 30 includes the struts 69 that are arranged around the semiconductor components 66, 67 in the line modules 60. With this configuration, the load applied to the semiconductor components 66, 67 when the first to fifth substrates 61 to 65 are pressed, and the load applied to the semiconductor components 66, 67 from the circuit board 40 are small, as compared to the configuration in which no strut 69 is provided.

(7) In the stacking direction of the circuit conductor layers 61A, 63A, 65A, the semiconductor components 66, 67 are overlapped with each other. With this configuration, the area of each of the line modules 60U, 60V, 60W can be reduced in the planar direction of the line modules 60, as compared to a configuration in which the semiconductor components 66, 67 are arranged side by side in the planer direction.

(8) Further, since the semiconductor components 66, 67 are overlapped with each other in the above-described stacking direction, the series line 68C is short, as compared to the hypothetical configuration in which the semiconductor components 66, 67 are arranged side by side. In particular, in each of the line modules 60U, 60V, 60W, the drain terminal 66D of the lower stage side semiconductor component 66 is opposed to the source terminal 67S of the upper stage side semiconductor component 67 in the above-described stacking direction. Thus, the series line 68C is short, as compared to a configuration in which the drain terminal 66D of the lower stage side semiconductor component 66 is not opposed to the source terminal 67S of the upper stage side semiconductor component 67 in the above-described stacking direction.

(9) The line modules 60U, 60V, 60W allow and interrupt electric power supply to the respective phases. With this configuration, it is not necessary to connect the line modules 60U, 60V, 60W directly to each other. Thus, it is possible to improve the degree of freedom in arrangement of the line modules 60U, 60V, 60W with respect to the base 70 and the circuit board 40.

The vehicle steering system 1 also includes various embodiments other than the above-described embodiment. Modified examples of the above-described embodiment will be hereinafter described, as the other embodiments of the vehicle steering system 1 according to the present invention. It is to be noted that the following modified examples may be combined with one another.

In the line modules 60 in the above-described embodiment, the line modules 60U, 60V, 60W are individually formed. On the other hand, in the line modules 60 in a modified example, at least two of the line modules 60U, 60V, 60W are formed integrally with each other.

Each of the line modules 60U, 60V, 60W includes the two struts 69 in the above-described embodiment. On the other hand, in a modified example, each of the line modules 60U, 60V, 60W includes one strut 69, or three or more struts 69. Further, in another modified example, each of the line modules 60U, 60V, 60W has no strut 69.

Each of the line modules 60U, 60V, 60W includes the lower stage side semiconductor component 66 and the upper stage side semiconductor component 67 in the above-described embodiment. On the other hand, in a modified example, at least one of the line modules 60U, 60V, 60W does not include at least one of the lower stage side semiconductor component 66 and the upper stage side semiconductor component 67. Further, in another modified example, in at least one of the line modules 60U, 60V, 60W, at least one of the lower stage side semiconductor components 66 and the upper stage side semiconductor components 67 is provided in plurality.

Each of the line modules 60U, 60V, 60W includes the first to third circuit conductor layers 61A, 63A, 65A in the above-described embodiment. On the other hand, in a modified example, at least one of the line modules 60U, 60V, 60W does not include one or two of the first to third circuit conductor layers 61A, 63A, 65A. In a modified example, at least one of the line modules 60U, 60V, 60W may have a configuration in which a single circuit conductor layer is provided. Further, in another modified example, at least one of the line modules 60U, 60V, 60W includes four or more circuit conductor layers.

The line modules 60U, 60V, 60W are arranged in one row in a widthwise direction of the circuit board 40 in the planer direction of the circuit board 40 in the above-described embodiment. On the other hand, in a modified example, the line modules 60U, 60V, 60W are arbitrarily arranged in the planer direction of the circuit board 40. With this configuration, it is possible to improve the degree of freedom in arrangement of the line modules 60U, 60V, 60W with respect to the circuit board 40 and the base 70.

In each of the line modules 60U, 60V, 60W, the semiconductor components 66, 67 are overlapped with each other in the stacking direction of the circuit conductor layers 61A, 63A, 65A in the above-described embodiment. On the other hand, in a modified example, in at least one of the line modules 60U, 60V, 60W, the semiconductor components 66, 67 are not overlapped with each other in the stacking direction of the circuit conductor layers 61A, 63A, 65A.

Figure 7:
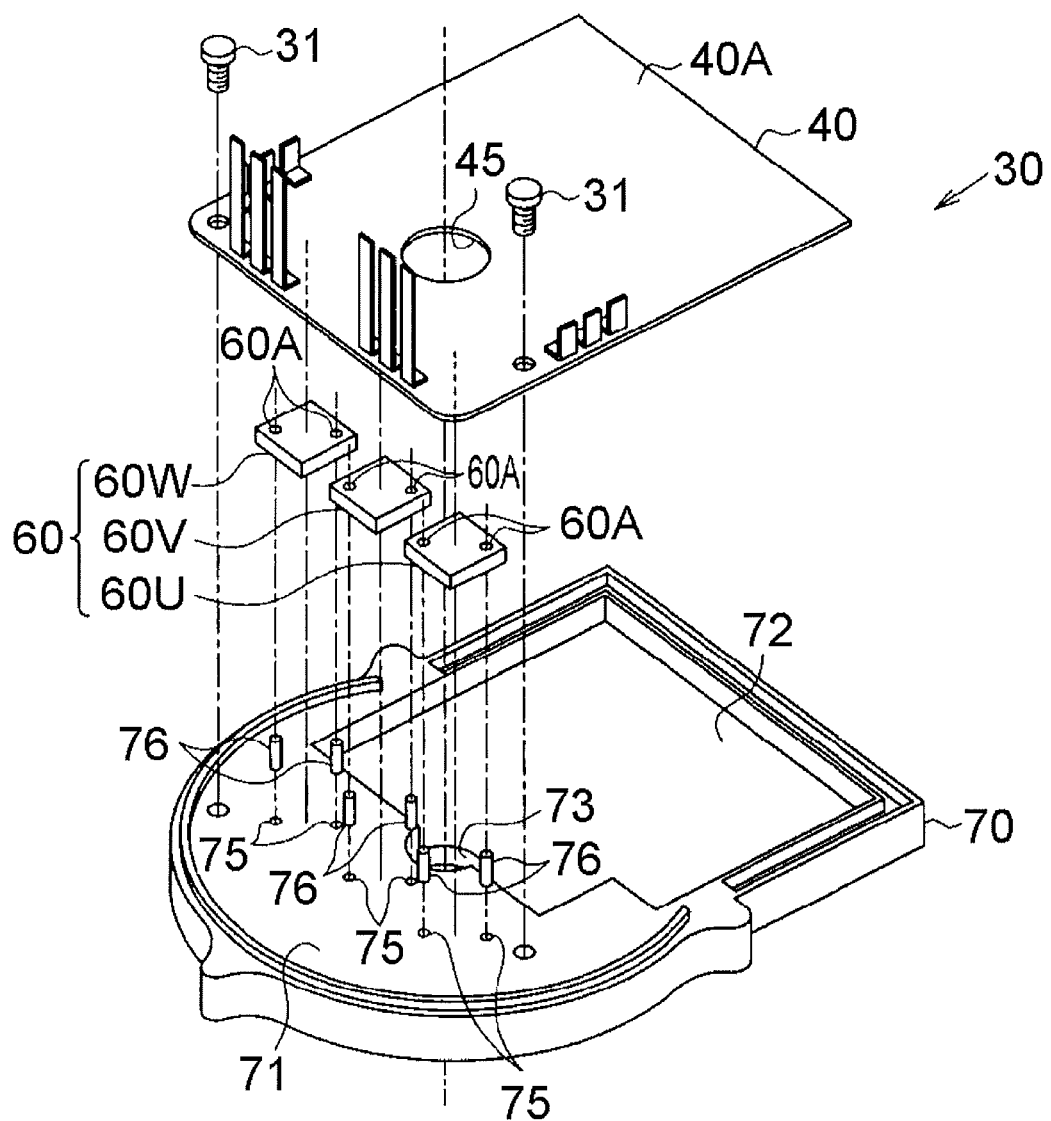
FIG. 7 is a perspective view illustrating an exploded perspective structure of a control device in another embodiment of the present invention.

The control device 30 in the above-described embodiment has the configuration in which the struts 69 of the line modules 60U, 60V, 60W are located on the mounting surface 71 of the base 70. On the other hand, in a modified example, the line modules 60U, 60V, 60W are configured as shown in FIG. 7. That is, the base 70 has six support holes 75 and struts 76 that are press-fitted in the respective support holes 75. In a state where the struts 76 are inserted in the through-holes 60A, the line modules 60U, 60V, 60W are disposed on the base 70. After the line modules 60U, 60V, 60W are disposed on the base 70, the struts 76 are flush with the circuit board 40-side surfaces of the line modules 60U, 60V, 60W. With this configuration, the positions of the line modules 60U, 60V, 60W with respect to the base 70 are determined by the struts 76. Thus, the struts 76 have two functions, that is, a function of reducing the load applied to the semiconductor components 66, 67 (refer to FIG. 6B) from the circuit board 40, and a function of determining the positions of the line modules 60U, 60V, 60W with respect to the base 70.

The control device 30 in the above-described modified example may have a configuration in which the struts 76 are formed integrally with the base 70. Further, the control device 30 in the above-described modified example may have another configuration in which the struts 76 are formed integrally with the first housing 23 or the second housing 24.

The base 70 in the above-described embodiment has the recessed portion 72. On the other hand, in a modified example, the base 70 has no recessed portion 72.

The control device 30 in the above-described embodiment includes the base 70 that is formed separately from the first housing 23 and the second housing 24. On the other hand, in a modified example, the control device 30 includes the base 70 that is formed integrally with the first housing 23 or the second housing 24. Further, in another modified example, the control device 30 has no base 70. In the control device 30 in this modified example, the circuit board 40 is fixed to the first housing 23 or the second housing 24. That is, in the control device 30 in this modified example, the first housing 23 or the second housing 24 corresponds to the base 70. With this configuration, the number of components of the assist device 20 (refer to FIG. 2) is reduced.

The control device 30 in the above-described embodiment has the configuration in which the line modules 60U, 60V, 60W are fixed to the base 70 through the thermal grease 74. On the other hand, in a modified example, the control device 30 has no thermal grease 74. That is, in the modified example, the control device 30 has a configuration in which the line modules 60U, 60V, 60W are fixed directly to the base 70.

The control device 30 in the above-described embodiment has the configuration in which the line modules 60 are sandwiched between the base 70 and the circuit board 40. On the other hand, in a modified example, the control device 30 has a configuration in which the circuit board 40 is fixed on the base 70, and the line modules 60 are fitted directly to the circuit board 40.

In the control device 30 in the above-described modified example, a heat sink may be fitted to a second surface of each of the line modules 60, the second surface being opposite to a first surface that is fitted to the circuit board 40. Instead of the heat sink, the first housing 23 may be fitted to the second surface of each of the line modules 60. With this configuration, heat of the semiconductor components 66, 67 in the line modules 60 is easily transferred to the heat sink or the first housing 23. Thus, the semiconductor components 66, 67 are restrained from overheating. Thus, it is possible to restrain the drive circuit from overheating.

The control device 30 in the above-described embodiment is used as the control device that controls the operation of the electric motor 21 in the assist device 20. On the other hand, the control device 30 in a modified example may be used as a control device that controls the operation of a device (for example, an electric motor in an electric pump device) that is installed in the vehicle steering system 1, and that is other than the assist device 20.

What is claimed is:

1. A control device comprising:
   a multi-layer circuit board in which a plurality of circuit conductors and a plurality of insulating layers are stacked such that each of the insulating layers is interposed between adjacent ones of the circuit conductors;
   a control circuit portion included in the plurality of circuit conductors and that outputs a control signal;
   a drive circuit portion included in the plurality of circuit conductors and that is controlled in response to the control signal;
   a line module directly fitted to the multi-layer circuit board and connected to the drive circuit portion of the multi-layer circuit board; and
   a base that retains the line module or the multi-layer circuit board; wherein the line module includes a semiconductor element and a strut, such that the strut is located radially outward of the semiconductor element, so as to support the line module.

2. The control device according to claim 1, wherein the strut is located between the base and the multi-layer circuit board so as to support the line module.

3. The control device according to claim 1, wherein a circuit element is located in a space that is defined by the multi-layer circuit board, the line module and the base.

4. A vehicle steering system comprising:
   the control device according to claim 1, and
   an electric actuator driven by the control device.

5. The control device according to claim 1, wherein the multi-layer circuit board includes a first surface and a second reverse surface, and one or more circuit elements are mounted on the first surface and the second reverse surface.

6. The control device according to claim 1, wherein the line module is disposed between the multi-layer circuit board and the base.

* * * * *